(12) United States Patent
Kamon et al.

(10) Patent No.: US 8,724,070 B2
(45) Date of Patent: May 13, 2014

(54) CONNECTING STRUCTURE OF ELECTRONIC APPARATUS AND DISPLAY DEVICE USING THE SAME

(71) Applicant: NLT Technologies, Ltd., Kanagawa (JP)

(72) Inventors: Youichirou Kamon, Kanagawa (JP); Hiroshi Haga, Kanagawa (JP); Tetsuroh Asakura, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 0 days.

(21) Appl. No.: 13/771,900

(22) Filed: Feb. 20, 2013

(65) Prior Publication Data

US 2013/0162922 A1     Jun. 27, 2013

Related U.S. Application Data

(62) Division of application No. 12/861,853, filed on Aug. 24, 2010, now Pat. No. 8,405,812.

(30) Foreign Application Priority Data

Aug. 25, 2009 (JP) ................. 2009-194602

(51) Int. Cl.
| | |
|---|---|
| *G02F 1/1345* | (2006.01) |
| *G02F 1/133* | (2006.01) |
| *H05K 1/00* | (2006.01) |
| *H05K 1/03* | (2006.01) |
| *H05K 1/11* | (2006.01) |

(52) U.S. Cl.
USPC ........... 349/152; 349/150; 174/254; 174/255; 174/261

(58) Field of Classification Search
USPC ............ 349/33, 149–152; 174/254, 255, 261; 361/803
See application file for complete search history.

(56) References Cited

U.S. PATENT DOCUMENTS 6,525,786 B1    2/2003  Ono

FOREIGN PATENT DOCUMENTS

| JP | 2005-077590 A | 3/2005 |
|---|---|---|
| JP | 2008-203590 | 9/2008 |

OTHER PUBLICATIONS

Machine translation of JP2008-203590.* Chinese Search Report dated Nov. 29, 2013, Application No. 2010102670264.

* cited by examiner

*Primary Examiner* — Uyen Chau N Le
*Assistant Examiner* — Michael Mooney
(74) *Attorney, Agent, or Firm* — Young & Thompson

(57) ABSTRACT

A connecting structure of the present invention includes a first substrate, a second substrate on which the first substrate is laminated, and a sheet like connection body having one end connected to one principal surface of the first substrate and another end connected to one principal surface of the second substrate, wherein a lengthwise direction of the sheet like connection body is parallel to a perimeter part of the first substrate, and the sheet like connection body has a slit part extending from one of end portions thereof to a part thereof along the lengthwise direction, and has a first end and a second end divided by the slit part at one of end portions, the first end is connected to a principal surface of the first substrate in vicinity of a peripheral part of the first substrate, and the second end is connected to a principal surface of the second substrate in vicinity of a peripheral part of the first substrate.

3 Claims, 9 Drawing Sheets

CONNECTING STRUCTURE OF ELECTRONIC APPARATUS AND DISPLAY DEVICE USING THE SAME

This application is based upon and claims the benefit of priority from Japanese Patent Application No. 2009-194602, filed on Aug. 25, 2009, the disclosure of which is incorporated herein in its entirety by reference.

TECHNICAL FIELD

The present invention relates to a connecting structure and a display device using that and in particular, relates to a connecting structure of an electronic apparatus and a display device using that.

BACKGROUND ART

As to electric connecting methods between terminals of an electronic apparatus, those methods are known such as a method using FPC (Flexible Printed Circuit), a method using a conductive tape, and a method using a conductive film. The FPC means such things that a metal thin film and a resin such as a polyimide covering it are bonded together with adhesive material. The conductive tape means such things that a metal thin film is coated with adhesive material having electrical conductivity. The conductive film means such things that a resin is made to have electrical conductivity by dispersing metal powder or the like into the resin. Such a flexible sheet (thin plate) like connection body including conductive layer is called a "sheet like connection body".

Because of such flexibility, a connecting method using such sheet like connection bodies is often used for such cases that a step exists between the connection terminals, and front and rear surfaces of a substrate are provided with the connection terminals, respectively. One example is disclosed in Japanese Patent Application Laid-Open No. 2008-203590. In this related art, a transparent conductive film formed on an outside surface of a color filter (CF) substrate of a liquid crystal display device and an electrode connected to a ground wiring on an array substrate are connected by using the conductive film across the step.

SUMMARY

An exemplary object of the present invention is to provide a connecting structure which can miniaturize a connecting structure portion at a step section of an electronic apparatus, and to provide a display device using that.

A connecting structure according to an exemplary aspect of the present invention includes a first substrate, a second substrate on which the first substrate is laminated, and a sheet like connection body having one end connected to one principal surface of the first substrate and another end connected to one principal surface of the second substrate, wherein a lengthwise direction of the sheet like connection body is parallel to a perimeter part of the first substrate, and the sheet like connection body has a slit part extending from one of end portions thereof to a part thereof along the lengthwise direction, and has a first end and a second end divided by the slit part at one of end portions, the first end is connected to a principal surface of the first substrate in vicinity of a peripheral part of the first substrate, and the second end is connected to a principal surface of the second substrate in vicinity of a peripheral part of the first substrate.

Another connecting structure according to another exemplary aspect of the present invention includes a first substrate, a second substrate on which the first substrate is laminated, and a sheet like connection body, wherein the first substrate covers a part of the second substrate so as to make a perimeter part of the first substrate as a boundary, one end portion of the sheet like connection body is connected to a principal surface of the first substrate in a vicinity of a peripheral part of the first substrate, and the other end portion of the sheet like connection body is projected from a perimeter part of the first substrate toward the second substrate which is not covered with the first substrate so as to be connected to a principal surface of the second substrate via an electric conductor arranged on the principal surface of the second substrate.

BRIEF DESCRIPTION OF THE DRAWINGS

Exemplary features and advantages of the present invention will become apparent from the following detailed description when taken with the accompanying drawings in which.

EXEMPLARY EMBODIMENT

Hereinafter, exemplary embodiments according to the present invention will be described with reference to drawings.

First Exemplary Embodiment

Figure 2:
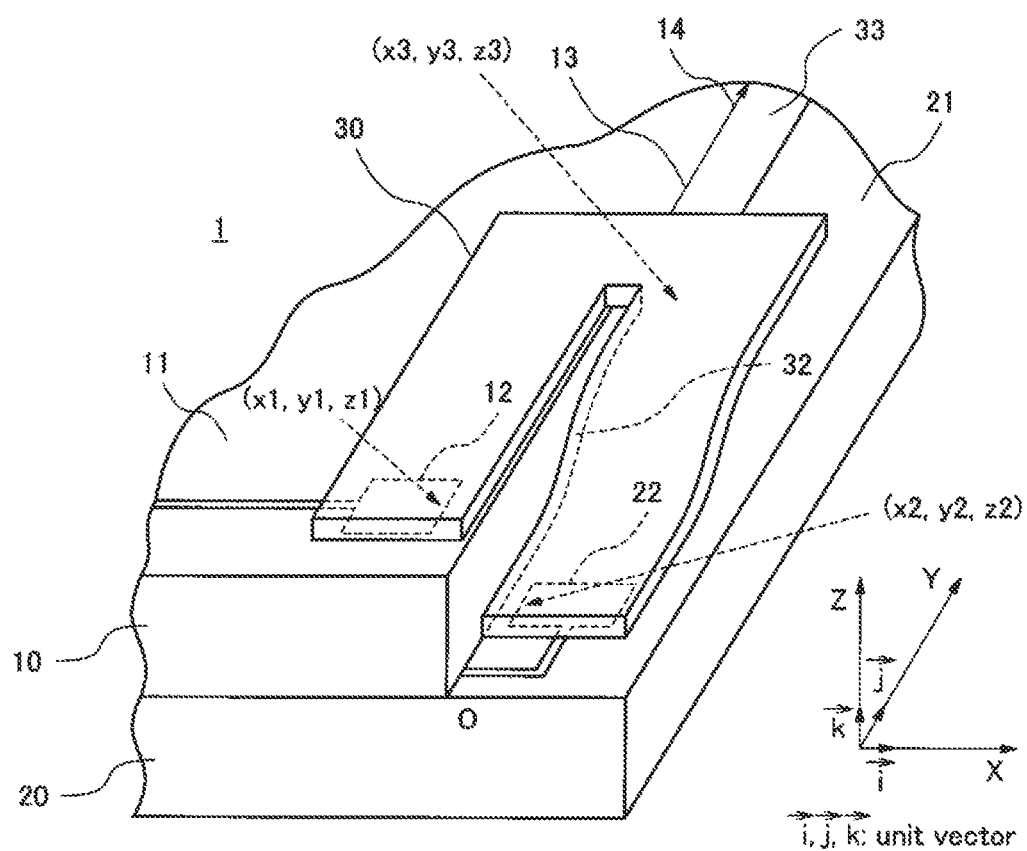
FIG. 2 is a perspective view showing an example of a connecting structure of an electronic apparatus of a first exemplary embodiment according to the present invention.

FIG. 2 is a perspective view showing an example of a connecting structure of an electronic apparatus of a first exemplary embodiment according to the present invention. The connecting structure includes a first substrate, a second substrate on which the first substrate is laminated, and a sheet like connection body. One end of the sheet like connection body is connected to a principal surface of the first substrate while the other end is connected to a principal surface of the second substrate. A lengthwise direction of the sheet like connection body is parallel to a perimeter part of the first substrate. The sheet like connection body is provided with a slit part extending from one end portion to a part of the sheet like connection body in the lengthwise direction of the slit and provided with a first end portion and a second end portion divided by the slit part at the one end portion. The first end portion is connected to the principal surface of the first substrate in a vicinity of a peripheral part of the first substrate, and the second end portion is connected to the principal surface of the second substrate in a vicinity of a peripheral part of the first substrate.

The connecting structure of an electronic apparatus of this exemplary embodiment will be described more in detail. An electronic apparatus 1 including a connecting structure has a configuration that a substrate 10 as the first substrate and a substrate 20 as the second substrate are laminated. A connection terminal 12 is provided on an outer principal surface 11 of the substrate 10. A connection terminal 22 is provided on an exposed inner principal surface 21 of the substrate 20 to which the substrate 10 does not overlap. The connection terminals 12 and 22 are made of conductor. An edge 13 exists at a perimeter part of the principal surface 11, and a tangent vector 14 is extending in a Y-direction in FIG. 2. A sheet like connection body 30, in which a conductive layer is included, connects the connection terminal 12 to the connection terminal 22 by crossing the edge 13. The sheet like connection body 30 is connected to the connection terminals 12 and 22, respectively, by using an ACF (Anisotropic Conductive Film), electrically conductive adhesives, solder or the like.

Areas where the sheet like connection body and the connection terminals are connected with low impedance in a direct current are such areas expressed by a logical product of three plan views, i.e., a plan view of the sheet like connection body, a plan view of the connection terminals and a plan view of either one of the ACF, the electrically conductive adhesives, the solder and the like. Those areas are called as "connection region" hereinafter.

In a three-dimensional rectangular coordinate X-Y-Z indicated in FIG. 2, the principal surface 11 and the principal surface 21 are approximately parallel to an XY-plane, and the edge 13 is approximately parallel to a Y-axis, and a coordinate origin is set at point "O" as shown in FIG. 2. Within each of the connection region of the connection terminals 12 and 22, those coordinate points on the connection terminal 12 and the connection terminal 22 with minimum distances from the edge 13 are set to be (x1, y1, z1) and (x2, y2, z2), respectively.

Here, when proceeding towards (x2, y2, z2) along the surface of the sheet like connection body 30 from (x1, y1, z1), the coordinate point on the surface of the sheet like connection body 30 where the Z-coordinate value of the surface of the sheet like connection body 30 becomes smaller than z1 for the first time is set to be (x3, y3 and z3). At that time, even if proceeding any kind of routes, the connecting structure of the electronic apparatus according to this exemplary embodiment satisfies a condition of |y2−y3|>|x2|.

In other words, according to the sheet like connection body of this exemplary embodiment, when the magnitude of a gradient vector expressed in a following equation reaches its maximum, the gradient vector becomes approximately parallel to a unit vector of Y-direction.

$$\frac{\partial z}{\partial X}\vec{i} + \frac{\partial z}{\partial Y}\vec{j}$$

Here, each unit vector of X, Y and Z directions is set to be $\vec{i}$, $\vec{j}$ and $\vec{k}$, and the coordinate point on the surface of the sheet like connection body is set to be (x, y, z).

Further expressed in a different way, the sheet like connection body of this exemplary embodiment has a configuration by which an end face 32 of the sheet like connection body 30 and an end face 33 of the substrate 10 are opposed to each other.

In that case, a curvature radius to a bend in a thickness direction of the sheet like connection body 30 is set to be larger than an inherent minimum curvature radius of the sheet.

Figure 3:
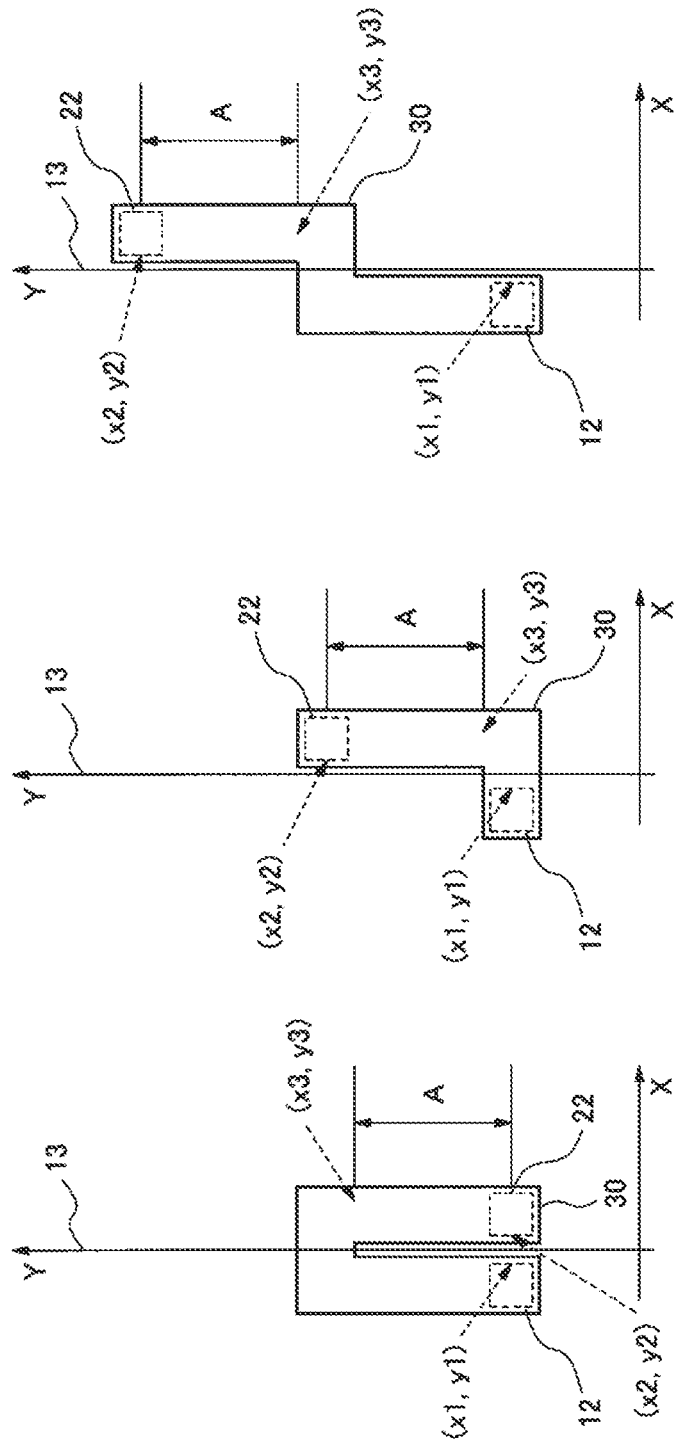
FIG. 3A is a simplified diagram showing a plan view of a connecting structure of an electronic apparatus of the first exemplary embodiment according to the present invention.
FIG. 3B is a simplified diagram showing a plan view of a modification of a connecting structure of an electronic apparatus of the first exemplary embodiment according to the present invention.
FIG. 3C is a simplified diagram showing a plan view of a different modification of a connecting structure of an electronic apparatus of the first exemplary embodiment according to the present invention.

FIG. 3 is a schematic diagram showing a top view of a connecting structure of an electronic apparatus 1 of the first exemplary embodiment. FIG. 3A indicates a case that Y-coordinate values of the connection terminals 12 and 22 are the same. FIG. 3B and FIG. 3C show modified exemplary embodiments and indicate those cases that Y-coordinate values of the connection terminals 12 and 22 can be different each other. A connecting structure shown in FIG. 2 corresponds to the case shown in FIG. 3A.

An indicated distance "A" in FIG. 3 corresponds to |y2−y3| described previously by referring to FIG. 2, that is, the distance between the connection terminal 22 and a part where the sheet like connection body 30 crossing the edge 13 from the principal surface 11 of the first substrate. A feature of the connecting structure according to this exemplary embodiment is that the above-mentioned distance "A" is larger than the minimum horizontal distance "Xmin" between the edge 13 and the connection terminal 22 shown in FIG. 1A.

Thus, according to this exemplary embodiment, the sheet like connection body does not need to be bent toward vertical direction at the edge of the substrate. Therefore, the minimum horizontal distance in the direction vertical to the end face 33 between the edge 13 and the lower connection terminal 22 can be even made zero theoretically. According to this exemplary embodiment, only a connecting process for each terminal of the sheet like connection body should be performed, and thereby a process for bending the sheet like connection body to conform to the step shape in advance becomes unnecessary.

Second Exemplary Embodiment

Figure 4:
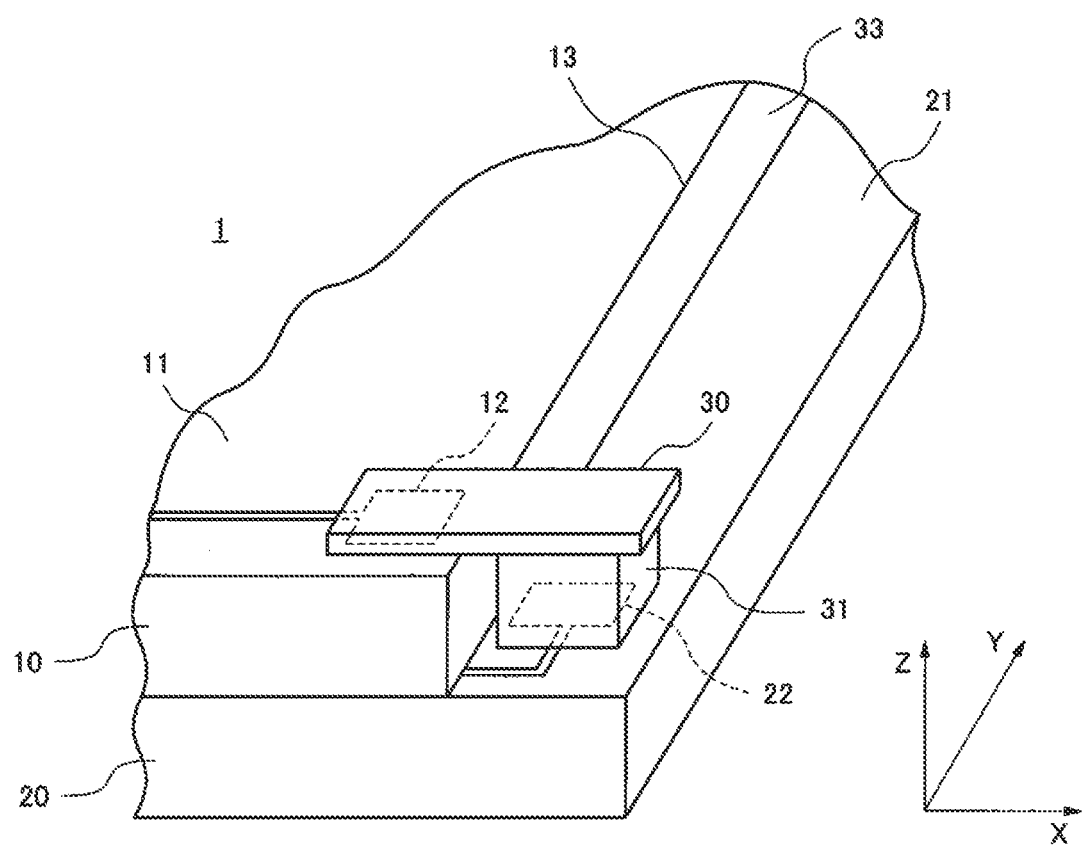
FIG. 4 is a perspective view showing a connecting structure of an electronic apparatus of a second exemplary embodiment according to the present invention.

FIG. 4 is a perspective view showing a connecting structure of an electronic apparatus of a second exemplary embodiment according to the present invention. The connecting structure according to this exemplary embodiment has a first substrate, a second substrate on which the first substrate is laminated and a sheet like connection body. The first substrate covers a part of the second substrate so as to make a perimeter part of the first substrate as a boundary, and one end portion of the sheet like connection body is connected to a principal surface of the first substrate in a vicinity of a peripheral part of the first substrate. On the other hand, the other end portion of the sheet like connection body is projected from a perimeter part of the first substrate toward the second substrate which is not covered with the first substrate so as to be connected to a principal surface of the second substrate via an electric conductor arranged on the principal surface of the second substrate.

The connecting structure of the electronic apparatus of this exemplary embodiment will be described more in detail. An electronic apparatus 1 including a connecting structure has a configuration that a substrate 10 as the first substrate and a substrate 20 as the second substrate are laminated with each other. A connection terminal 12 is provided on an outer principal surface 11 of the substrate 10. An edge 13 exists on the principal surface 11. A connection terminal 22 is provided on an exposed inner principal surface 21 of the substrate 20 to which the substrate 10 does not overlap. The principal surface 11 and the principal surface 21 are approximately parallel to each other. In a three-dimensional rectangular coordinate X-Y-Z indicated in FIG. 4, the principal surface 11 and the principal surface 21 are approximately parallel to an XY-plane. The connection terminals 12 and 22 are made of conductor. The sheet like connection body 30 includes a conductive layer, and an electric conductor 31 is provided with a height approximately equal to a thickness of the substrate 10.

In a connecting structure of an electronic apparatus according to this exemplary embodiment, the sheet like connection body 30 is connected to the connection terminal 12 so as to cross an extended plane of an end face 33 of the first substrate 10. The sheet like connection body 30 and an electric conductor 31 are connected electrically to each other at the position whose Z-coordinate value is approximately the same as that of the connection terminal 12. The connection terminal 22 and the electric conductor 31 are connected electrically to each other.

The sheet like connection body 30 is connected to the connection terminal 12 and the electric conductor 31, respectively, by using the ACF, electrically conductive adhesives, solder or the like. The electric conductor 31 and the connection terminal 22 are also connected to each other in a same manner.

Thus, also in this exemplary embodiment, the sheet like connection body does not need to be bent toward vertical direction at the edge of the substrate. Therefore, the minimum horizontal distance in the direction vertical to the end face 33 between the edge 13 and the lower connection terminal 22 can be even made zero theoretically. According to this exemplary embodiment, only a connecting process for each terminal of the sheet like connection body should be performed, and a process becomes unnecessary in which the sheet like connection body is bent to conform to the step shape in advance.

A third exemplary embodiment of the invention is a connecting structure of an electronic apparatus which includes a first plane (11 in FIG. 2) with a first conductor approximately parallel to an XY-plane in a three-dimensional rectangular coordinate system X-Y-Z, a second plane (21 in FIG. 2) with a second conductor approximately parallel to the XY-plane, an edge (13 in FIG. 2) of the first plane approximately parallel to a Y-axis, and a flexible sheet like connection body (30 in FIG. 2) with a conductive layer. When an X-coordinate origin is set to the edge while a positive direction of a Z-coordinate is set to a direction from the second plane toward the first plane, the first conductor and the sheet like connection body are electrically connected to each other by a first connection terminal (12 in FIG. 2), while the second conductor and the sheet like connection body are electrically connected to each other by a second connection terminal (22 in FIG. 2). The sheet like connection body has such a configuration that is extended from the first connection terminal to reach the second connection terminal across the edge. When proceeding along a surface of the sheet like connection body from the first connection terminal towards the second connection terminal, it is characterized in that a Y-component of a distance between the second connection terminal and a point that a Z-coordinate value becomes smaller than the first plane for a first time is larger than an X-component of a distance between the edge and the second connection terminal.

A fourth exemplary embodiment of the invention is a connecting structure of an electronic apparatus which includes a laminated structure of a first substrate (10 in FIG. 4) and a second substrate (20 in FIG. 4) each having a plane approximately parallel to a XY-plane in a three-dimensional rectangular coordinate system X-Y-Z. The first substrate has a first connection terminal (12 in FIG. 4) provided on an outside plane (11 in FIG. 4) of the first substrate, an edge (13 in FIG. 4), and an end face (33 in FIG. 4) including the edge. The connecting structure of an electronic apparatus further includes the second connection terminal (22 in FIG. 4) provided on an exposed surface (21 in FIG. 4) of the second substrate on which the first substrates does not oppose, a flexible sheet like connection body (30 in FIG. 4) with a conductive layer, and an electric conductor (31 in FIG. 4) with a height corresponding to a thickness of the first substrate. The sheet like connection body is electrically connected to the first connection terminal and intersects with an extended plane of the end face. The sheet like connection body and the electric conductor are electrically connected to each other at a portion where its Z-coordinate value is the same as that of the first connection terminal, and the second connection terminal has a configuration electrically connected to the electric conductor.

As to the related art, its analysis performed by inventors of the present application will be described hereinafter. In a connection of an electronic apparatus by using a sheet like connection body of the related art, there exists a minimum curvature radius as to the bend in a thickness direction of the sheet like connection body itself. Therefore, when a difference in height (step) exists between the connection terminals, a minimum value of a horizontal distance between the lower connection terminal and an edge at a step section turns out to be such values ranged from the same level of the minimum curvature radius of the sheet like connection body to several times of that. That is, in the related connecting structure using the sheet like connection body, there is a problem that a space for mounting the sheet like connection body becomes large.

Figure 1A:
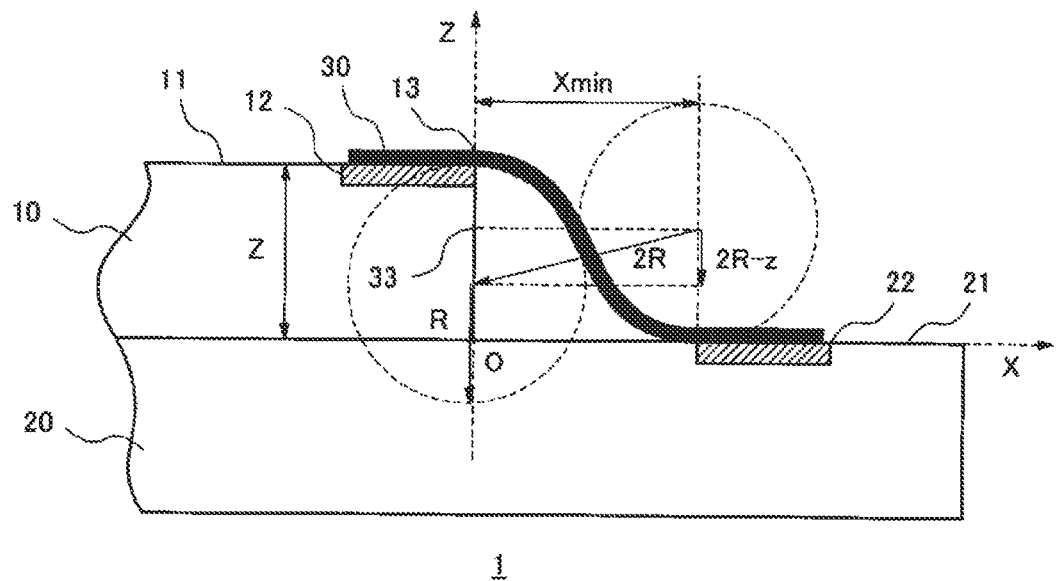
FIG. 1A is a cross-sectional view of a connecting structure of an electronic apparatus by using a sheet like connection body of the related art.

The problem mentioned above will be described more in detail based on the connecting structure disclosed in Japanese Patent Application Laid-Open No. 2008-203590. FIG. 1A is a cross-sectional view of an electronic apparatus connecting structure using the sheet like connection body in the related art.

An electronic apparatus 1 includes a first substrate 10 having a principal surface 11 and an edge 13, a connection terminal 12 provided on the substrate 10, a second substrate 20 having a principal surface 21, a connection terminal 22 provided on the second substrate, and a sheet like connection body 30. The principal surface 11 and the principal surface 21 are approximately parallel to each other. The substrate 10 has an end face 33 approximately vertical to the principal surface 11. The one side edge of the connection terminal 12 is located on an approximately same position of the edge 13. The sheet like connection body 30 is connected to the connection terminal 22 from the connection terminal 12 across the step. As shown in FIG. 1A, a contacting position of the end face 33 and the principal surface 21 is set to be the origin "O" and thereby an x-direction and a z-direction are specified. The minimum curvature radius of the sheet like connection body 30 is represented by "R", and the height of the step between two substrates is represented by "z", and the horizontal distance between the edge 13 and the connection terminal 22 is represented by "X". In such case, a minimum horizontal distance "Xmin" is determined as shown in following calculating equations.

If a condition of z≥2R is satisfied, then following equation (1) is obtained.

$$Xmin = 2R \quad (1)$$

If a condition of 0<z<2R is satisfied, then following equation (2) is obtained.

$$Xmin = \sqrt{z(4R-z)} \quad (2)$$

The above-mentioned equations are derived by assuming that the sheet like connection body is zero thick, and an X-coordinate value and a Z-coordinate value of the sheet like connection body do not take a same numerical value twice or more except for the connection terminal part. If the connection terminals are connected smoothly by using the sheet like connection body at a part of a step, these restrictions are natural assumptions.

As an example, when the minimum curvature radius "R" is set to be 1000 μm and the height "z" of the step is set to be 1000 μm, the formula (2) shows that the minimum horizontal distance needs to be about 1732 μm for the terminal connections.

Next, another case will be described in which the restrictions by the connecting structure disclosed in the Japanese Patent Application Laid-Open No. 2008-203590 and a part of the above-mentioned restrictions are removed.

Figure 1B:
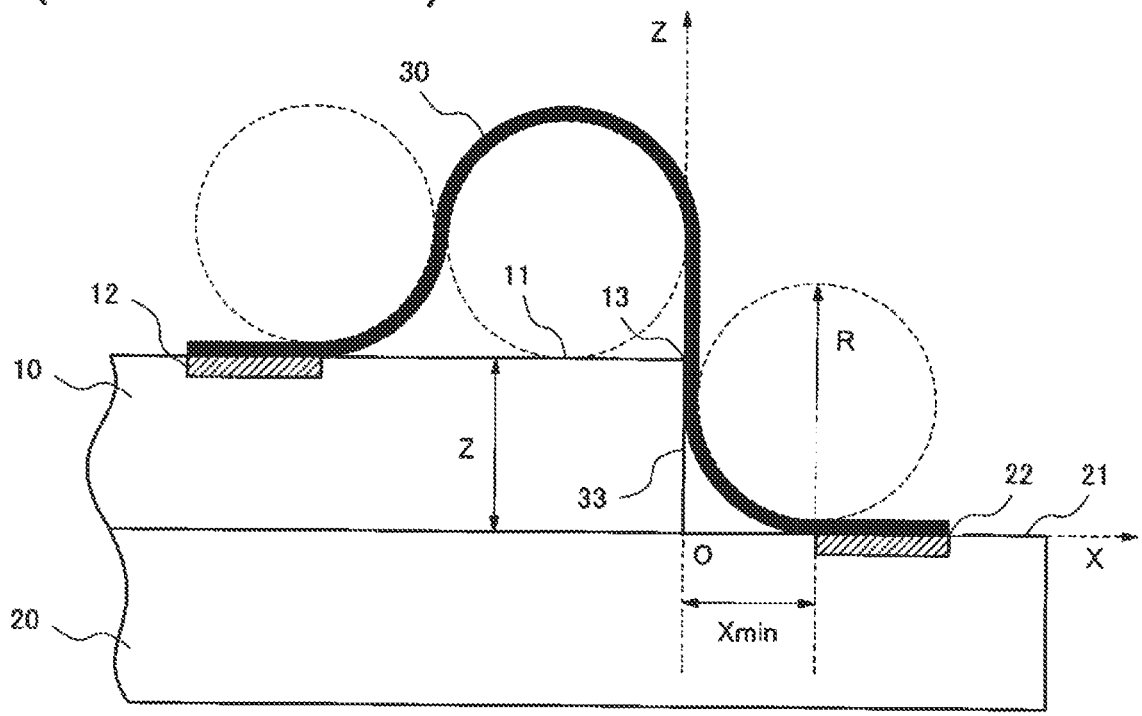
FIG. 1B is a cross-sectional view of a connecting structure of an electronic apparatus by using another sheet like connection body of the related art.

That is, as shown in FIG. 1B, the connection structure has a such structure that the connection terminal 12 is located away from the X-coordinate origin, and the sheet like connection body is located above the principal surface 11 without closely contacting to the principal surface 11. In such a case, the minimum horizontal distance "Xmin" is represented by following equations.

If a condition of z≥R is satisfied, then following equation (3) is obtained.

$$Xmin = R \quad (3)$$

If a condition of 0<z<R is satisfied, then following equation (4) is obtained.

$$Xmin = \sqrt{z(2R-z)} \quad (4)$$

For example, when the minimum curvature radius "R" is set to be 1000 μm and the height "z" of the step is set to be 800 μm, the formula (4) shows that the minimum horizontal distance needs to be about 978 μm for the terminal connections.

In this way, there is a problem that owing to the minimum curvature radius peculiar to the sheet like connection body, there is a lower limit for a minimum horizontal distance between the edge and the lower connection terminal, which requires the more mounting space.

In recent years, a mounting space for the electronic apparatus tends to become smaller, and thus a mounting is required to be as compact as possible. Further, if the horizontal distance between the edge and the lower connection terminal is close to the above-mentioned minimum value, there is a problem that a process for bending the sheet like connection body is required to conform to the step shape in advance.

An exemplary advantage according to the invention is that the minimum horizontal distance required for the above-mentioned connection between the edge and the lower connection terminal can be made zero. This is because the sheet like connection body does not need to be bent into a direction vertical to the edge at the step part, and thus the minimum horizontal distance between the edge and the lower connection terminal is freed from the restrictions by the minimum curvature radius of the sheet like connection body.

Another exemplary advantage according to the invention is that if the edge is set to the above-mentioned principal surface 21, a distance between the edge of the principal surface 11 and the edge of the principal surface 21 can be reduced compared with the related technology, and thus a miniaturization for the connecting structure portion can be realized. This advantage is remarkable in such a case that a position of the edge of the principal surface 21 determines the size of the electronic apparatus. The reason why this advantage is obtained is as follows. Because a slope of the sheet like connection body is approximately parallel to the edge, the horizontal distance between the connecting portion provided on the principal surface 21 and the edge of the principal surface 11 is freed from the restrictions by the minimum curvature radius peculiar to the connection body. Therefore, the connecting portion of the principal surface 21 can be provided on a vicinity of the edge of the principal surface 11, and it is possible to reduce an area required for the principal surface 21.

Further exemplary advantage according to the invention is that a production of the sheet like connection body can be made easy. The reason is that the process is not required in which the sheet like connection body is bent to conform to the step shape in advance.

Yet another exemplary advantage according to the invention is that a heat pressure welding step of the ACF (Anisotropic Conductive Film) on the principal surface 11 and the principal surface 21 can be carried out in a same process in a connecting structure according to the second exemplary embodiment mentioned above. In other words, the sheet like connection body can be connected to the principal surface 11 and the principal surface 21, respectively, with one process using the ACF. This is because, when the entire surface of the upper part of the sheet like connection body is thermally pressed with a welding machine, the ACF of the upper connection terminal is thermally pressed, and at the same time, a heat pressure welding is also performed in the lower connection terminal because its heat is also transmitted to the ACF of the lower connection terminal through the electric conductor.

Next, examples of the present invention will be described with reference to drawings.

Example 1

In this example, a liquid crystal display (LCD) 101 integrated with a touch sensor is described as an example. The touch sensor detects a position coordinate indicated by using a finger, a pen or the like, or detects whether an indicating operation is performed or not. In a production of a display device enabling a touch input, first, a flat display device such as the liquid crystal display device (LCD) and a touch sensor module are prepared respectively. Then, they are put together so that the touch sensor module covers a screen of the flat display device.

As one of touch sensor types, a capacitive type is known. The capacitive type is further classified into a projected capacitive type and a surface capacitive type. This example describes a case in which the surface capacitive type is employed as a type of the touch sensor. As to the touch sensor of the surface capacitive type, its basic device is disclosed in U.S. Pat. No. 4,293,734, and a related technology is disclosed in Japanese Patent Application Publication No. Sho 56-500230.

The surface capacitive type touch sensor includes a transparent substrate, a uniform transparent conductive film formed on the transparent substrate, and an insulating thin film formed thereon. This transparent conductive film is called a position detecting conductive film. When driving this touch sensor, alternating voltage is applied to four corners in this position detecting conductive film. When touching the touch sensor with a finger, minute electric current flows into the finger through a capacitor formed between the position detecting conductive film and the finger. This electric current flows from each of the corners to the point where a finger touches. A signal processing circuit detects whether a finger touches or not by means of summing the respective electric currents. The signal processing circuit calculates the coordinate values of the touch position from a ratio of the respective electric currents.

In this example, a liquid crystal display device integrated with the touch sensor is made by depositing this position detecting conductive film on a color filter substrate of the liquid crystal display device. A plan view of the liquid crystal display device 101 integrated with the touch sensor according to this example is shown in FIG. 5, and cross-sectional views taken along dotted lines of VIA-VIA and VIB-VIB shown in FIG. 5 are shown in FIG. 6A and FIG. 6B, respectively.

Figure 5:
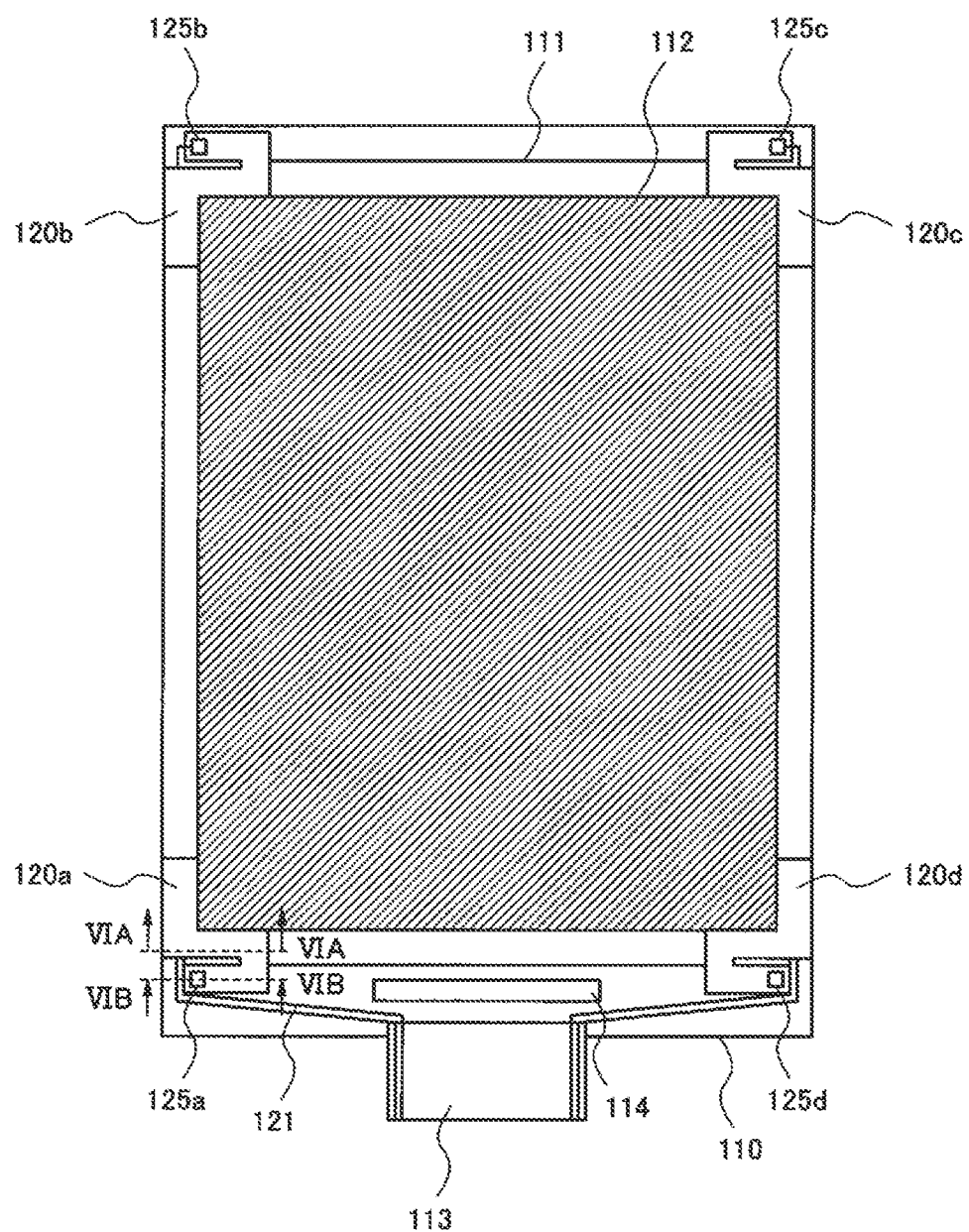
FIG. 5 is a plan view of a liquid crystal display device of a first example according to the present invention.
Figure 6A:
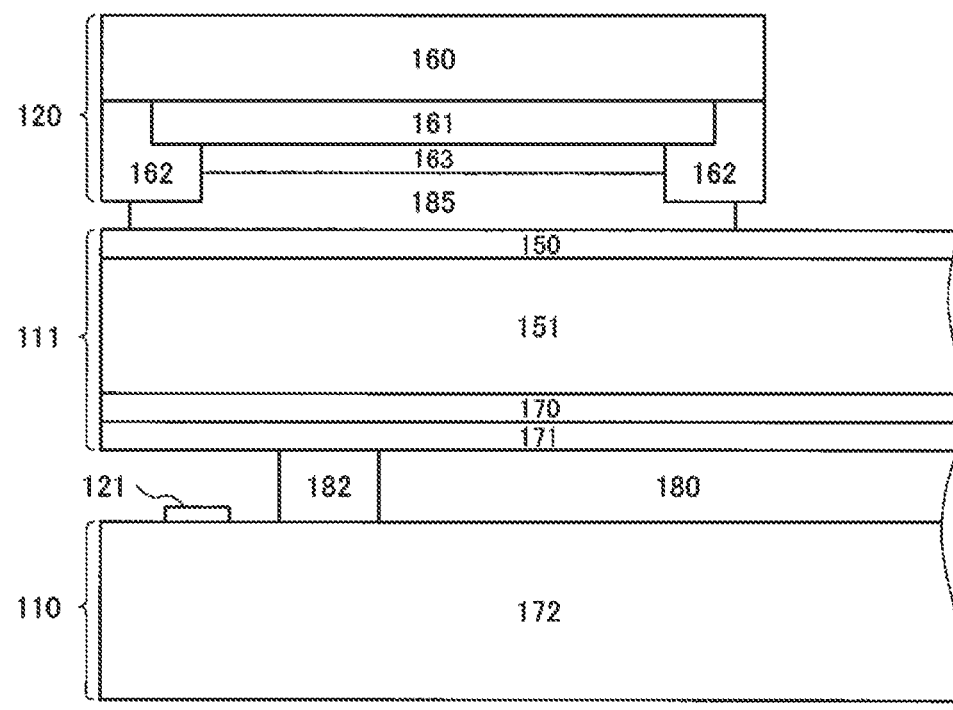
FIG. 6A is a cross-sectional view taken along dotted line VIA-VIA shown in FIG. 5.
Figure 6B:
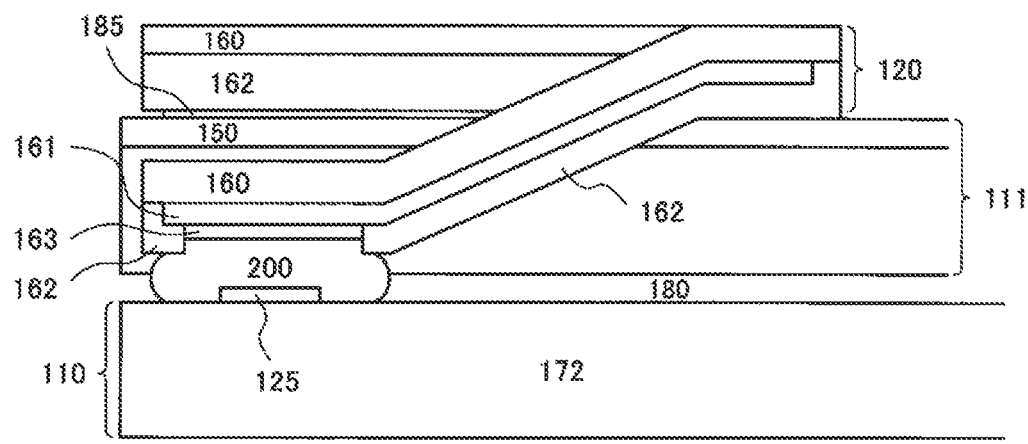
FIG. 6B is a cross-sectional view taken along dotted line VIB-VIB shown in FIG. 5.

As shown in FIG. 5, this display device includes a TFT (Thin Film Transistor) substrate 110, a color filter (CF) substrate 111 and a CF-side polarizer 112. These are laminated in this order.

On a surface of the color filter substrate 111 to which the CF-side polarizer 112 is to be bonded, an indium tin oxide (ITO) film 150 functioning as the position detecting conductive film is formed. This ITO film 150 is previously deposited on a glass substrate 151 which is a base material of the color filter substrate 111 prior to manufacturing the color filter.

The TFT substrate 110 is fabricated by using a photolithographic method of a related TFT-LCD manufacturing technology. The TFT substrate 110 is provided with pixel electrodes, pixel switching TFTs, peripheral circuit TFTs, metal wirings 121, and connection terminals 125. On the TFT substrate 110, a driver IC 114 for driving a display area is mounted by using a COG (Chip On Glass) method. Main input signals of the driver IC are supplied via wirings formed on an FPC 113 and the TFT substrate 110, and main output signals of the driver IC are supplied to the display area.

Four end portions corresponding to four sides of the color filter substrate 111 are arranged such that positions of left and right end portions are located on the same positions as the end portions of the TFT substrate 110, while positions of upper and lower end portions are located within the position of the end portions of the TFT substrate 110.

Four corners of the color filter substrate 111 are connected with FPCs 120a-120d, respectively. These FPCs correspond to the sheet like connection body in the above-mentioned exemplary embodiments. One end of each FPC is electrically connected to the ITO film 150 of the position detecting conductive film. The other end of each FPC is electrically connected to the connection terminals 125a-125d arranged on four corners on the TFT substrate 110. As a result, the ITO film 150 and the connection terminal 125 on the TFT substrate 110 are electrically connected to each other. The connection terminals 125 provided on four corners on the TFT substrate 110 are connected to the wirings on the TFT substrate 110, respectively. These wirings are gathered at a bottom end of the TFT substrate 110, and they are connected to the FPC 113. The FPC 113 is electrically connected to an external signal processing circuit.

As shown in FIG. 6A, the FPC 120 has a base film 160, a copper foil 161, a cover film 162, adhesive material (not shown) bonding these together, and a solder plating 163 in the terminal portion. This FPC 120 can be fabricated by using such material that is low in cost and generally available. Specifically, the base film and the cover film are made of polyimide with a thickness of about 25 micrometers, respectively, and the copper foil has a thickness of about 35 micrometers, and a thickness of the solder plating is set to be about 5 micrometers. If this FPC is bent, the minimum curvature radius is about 500 micrometers.

The color filter substrate 111 has the ITO film 150 as the position detecting conductive film, the glass substrate 151 with a thickness of about 500 micrometers, a black matrix layer 170, a color filter layer (not shown), and an ITO film 171 as a counter electrode of the LCD. If necessary, an overcoat layer may be provided thereon.

The TFT substrate 110 includes a glass substrate 172 having a thickness of about 500 micrometers and the wirings 121, and holds a liquid crystal 180 together with the color filter substrate 111 and a sealing member 182. Further, the liquid crystal 180 is injected through a filler inlet provided at a side-end of left side in FIG. 5. The FPC 120 and the ITO film 150 on the color filter substrate 111 are connected physically and electrically by using the ACF 185.

As shown in FIG. 6B, the FPC 120 is connected to the connection terminal 125 arranged on the TFT substrate 110 by using the ACF 200. Because the FPC 120 is arranged across the step between the TFT substrate 110 and the color filter substrate 111, it has a slope indicated in the cross-sectional view shown in FIG. 6B.

Figure 7:
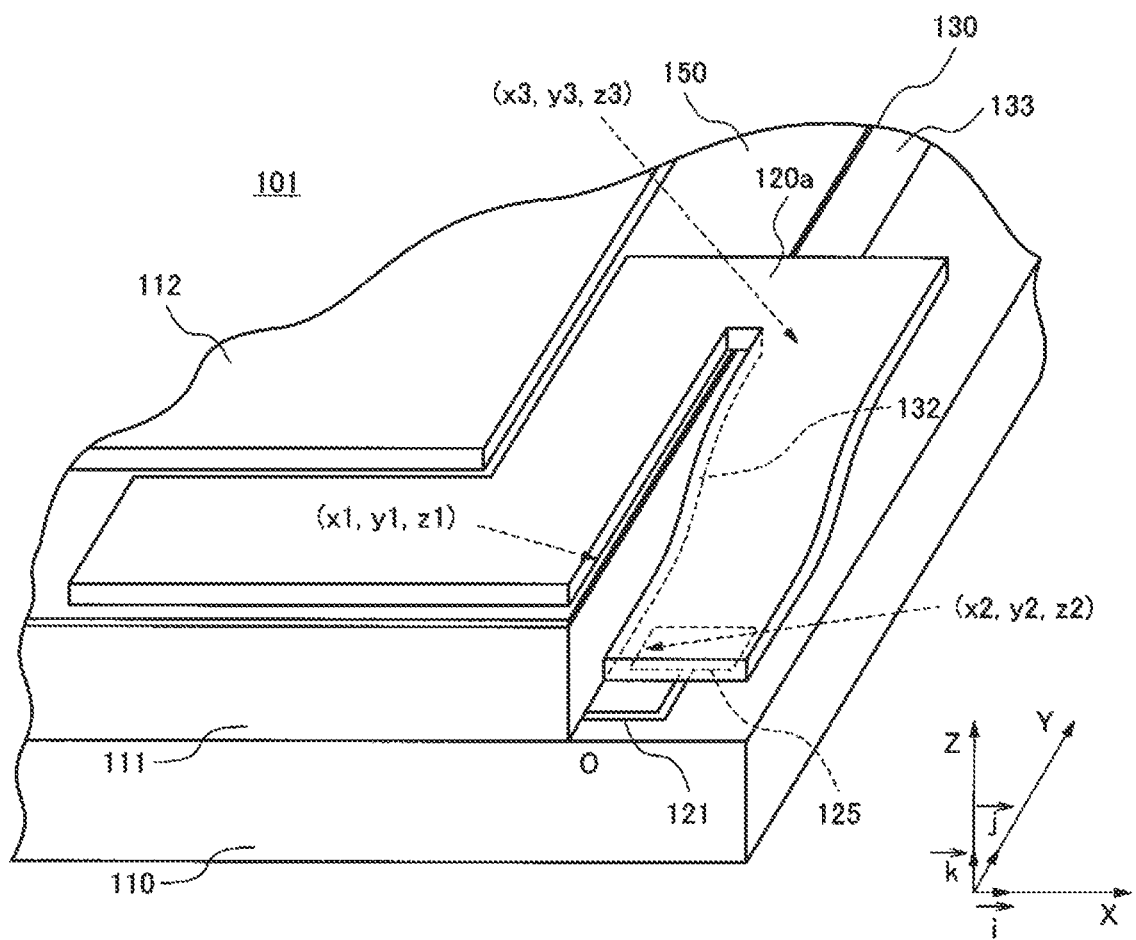
FIG. 7 is a perspective view of a vicinity of an FPC of a liquid crystal display device of the first example according to the present invention.

Next, a shape of the FPC 120 will be described in detail with reference to FIG. 5, FIG. 6 and FIG. 7. FIG. 7 is a perspective view in a vicinity of the FPC 120. The FPC 120a will be described which is arranged at a bottom left corner of FIG. 5 as an instance. At the connecting portion with the position detecting conductive film, the FPC 120a has a shape of a capital letter "L". A most suitable size for the shape of the capital letter "L" depends on a display size of the display device. For example, in a case of the display device with a display area having a length of 3.5 inches between opposing corners, the FPC 120a has a longitudinal length of about 8 mm, and lateral length of about 6 mm, and a width of about 1.5 mm. In this area, as shown in FIG. 7, the FPC 120a is on a same plane of the position detecting conductive film. The FPC 120a changes its direction from the end portion of the shape of the capital letter "L" to downward direction of FIG. 5 and extends beyond the edge 130 of the CF substrate 111. Next, the FPC 120a changes its direction to leftward direction to reach the connection terminal on the TFT substrate 110. Here, the FPC 120a is arranged with a slope corresponding to the step between the CF substrate 111 and the TFT substrate 110.

Paying attention to the slope of the FPC 120a, the magnitude of the slope is equal to zero or very small in such areas where the FPC 120a is located on the CF substrate 111 and where the FPC 120a crosses over the edge 130 of the CF substrate 111. In an area where the FPC 120a changes its direction to leftward direction and then reaches the connection terminal 125 on the TFT substrate 110, the angle of the slope becomes maximum value.

Next, the feature of the connecting structure of this example will be described from a different view. The FPC 120 has the shape that its central line intersects with the edge 130 and then extends toward the connection terminal 125. Here, each coordinate axis of a three-dimensional rectangular coordinate X-Y-Z is arranged as shown in FIG. 7. The principal surface of the TFT substrate 110 and the exposed principal surface of the CF substrate 111 are approximately parallel to an XY-plane, and the edge 130 is approximately parallel to a Y-axis. In a part where the FPC 120a and the ITO film 150 are connected by means of the ACF 185, the coordinate value of a point on the ITO film 150 that the distance from the edge 130 is minimum is set to be (x1, y1, z1) within an area (connection region 1) where each planar shape of the FPC 120a, the ITO film 150 and the ACF 185 overlaps each other. In a part where the FPC 120a and the connection terminal 125 are connected by means of the ACF 200, the coordinate value of a point on the connection terminal 125 that the distance from the edge 130 is minimum is set to be (x2, y2, z2) within an area (connection region 2) where each planar shape of the FPC 120a, the connection terminal 125 and the ACF 200 overlaps each other.

Next, when advancing from the point (x1, y1, z1) towards the point (x2, y2, z2) along the surface of the FPC 120a, a point where a Z-coordinate value on the surface of the FPC 120a becomes smaller than "z1" for the first time is set to be (x3, y3, z3). Here, the connecting structure of this example has a configuration which satisfies following inequality even if progressing along any kind of routes.

$|y2-y3|>|x2|$

Specific numerical values in this example are illustrated below (a scale unit is μm).

$(x1,y1,z1)=(-10,2500,500),$ $(x2,y2,z2)=(200,2500,0),$ $(x3,y3,z3)=(800,4500,499),$ and $|y2-y3|=2000>1x2|=200.$ In the following, the feature of the connecting structure of this example will be described from a further different view. The FPC 120 has a shape that its central line intersects with an extended plane of the end face 133 and then extends toward the connection terminal 125. Here, paying attention to the end face 133 of the CF substrate 111 including the edge 130 and the end face 132 of the FPC 120, they are arranged so as to be opposed each other. In such opposed area of both end faces, the FPC 120 has a slope determined by depending on the step difference between the CF substrate 111 and the TFT substrate 110.

The FPC 120 is connected by following procedure. First, the ACF 185 and the ACF 200 are temporarily press-contacted on a portion of the capital letter "L" of the FPC 120 and a portion connected to the connection terminal 125, respectively. Next, the FPC 120 and the connection terminal 125 on the TFT substrate 110 are welded with thermal pressure, and finally the FPC 120 and the portion of the capital letter "L" on the CF substrate 111 are welded with thermal pressure. The reason that the TFT substrates 110 is welded firstly with thermal pressure is to avoid the following case. That is, if the portion of the capital letter "L" having larger connecting area is welded firstly with thermal pressure, the ACF on the connection terminal portion reacts due to heat conduction and a pressure welding cannot be carried out.

The FPC 120 has an air-bridge structure where a portion of that is not fixed to the substrate. Accordingly, such a spaced portion between the FPC 120 and the TFT substrate 110 may be filled with a silicone resin or the like to reinforce the connection structure if necessary. By such reinforcement, the FPC 120 becomes sturdy for peeling, and it is possible to realize a connecting structure which is resistant to a degradation of a connection terminal caused by permeation of water or gas.

In this example, the following advantages are obtained. That is, the distance between the CF substrate end and the connection terminal on the TFT substrate could be made small sufficiently, compared with the related art. Specifically, although the related art requires the above mentioned distance to be about 900 micrometers, this example can be made with the distance of about 200 micrometers. As a result, a frame size of the LCD can be reduced. In particular, advantage for reducing upper side frame size in FIG. 5 is remarkable in such a case of designing an electronic apparatus using this liquid crystal display module.

The FPC used in this example does not require a special feature about a bending capability. Therefore, according to this example, such advantage can be obtained that the distance between the CF substrate end and the connection terminal on the TFT substrate can be made smaller by using commonly available low-price members.

In a related touch sensor, by being provided with wirings around the touch sensor board, four corners of the touch sensor board are electrically connected to a signal processing circuit.

In this case, because the vicinities of the area provided with the wirings are invalid range for a touch input, those areas are unnecessary regions for utilizing the touch sensor and designing the equipment using the touch sensor. On the other hand, according to this example, because these wirings can be provided on the TFT substrate, such unnecessary areas can be eliminated. As mentioned above, because these wirings are formed by using photolithography method in the manufacturing steps of the TFT substrate, its processing accuracy is sufficiently high. For this reason, in order to be provided with these wirings, the size of the TFT substrate does not need to be made larger than that of the related art.

The touch sensor of the related art needs a base material on which the position detecting conductive film is formed. In this example, however, since the CF substrate can combine the base material, a reduction of members, a weight saving and a thinning of the device can be realized. Furthermore, although the base material is located in the optical path of the display device of the related art, the base material can be cut-down according to this example. Therefore, it is possible to reduce a harmful reflected light, and improve an optical transmittance of the LCD, and as a result, display performance of the display device can be improved.

In this example, although four FPCs 120 are provided on four corners, other structure may be available. For example, if a one-dimensional touch sensor is used, it can be fabricated with two FPCs 120. Furthermore, depending on a shape of the touch sensor, the device can be fabricated with any FPCs of two or more numbers.

Example 2

This example will describe a connecting structure of an antistatic transparent conductive film in an In-Plane-Switching (IPS) mode liquid crystal display device. The IPS mode liquid crystal display device has a feature that wide view angle characteristic is obtained by applying an electric field to the liquid crystal in a direction parallel to a liquid crystal cell plane and thereby rotating liquid crystal molecules in plane.

Figure 8:
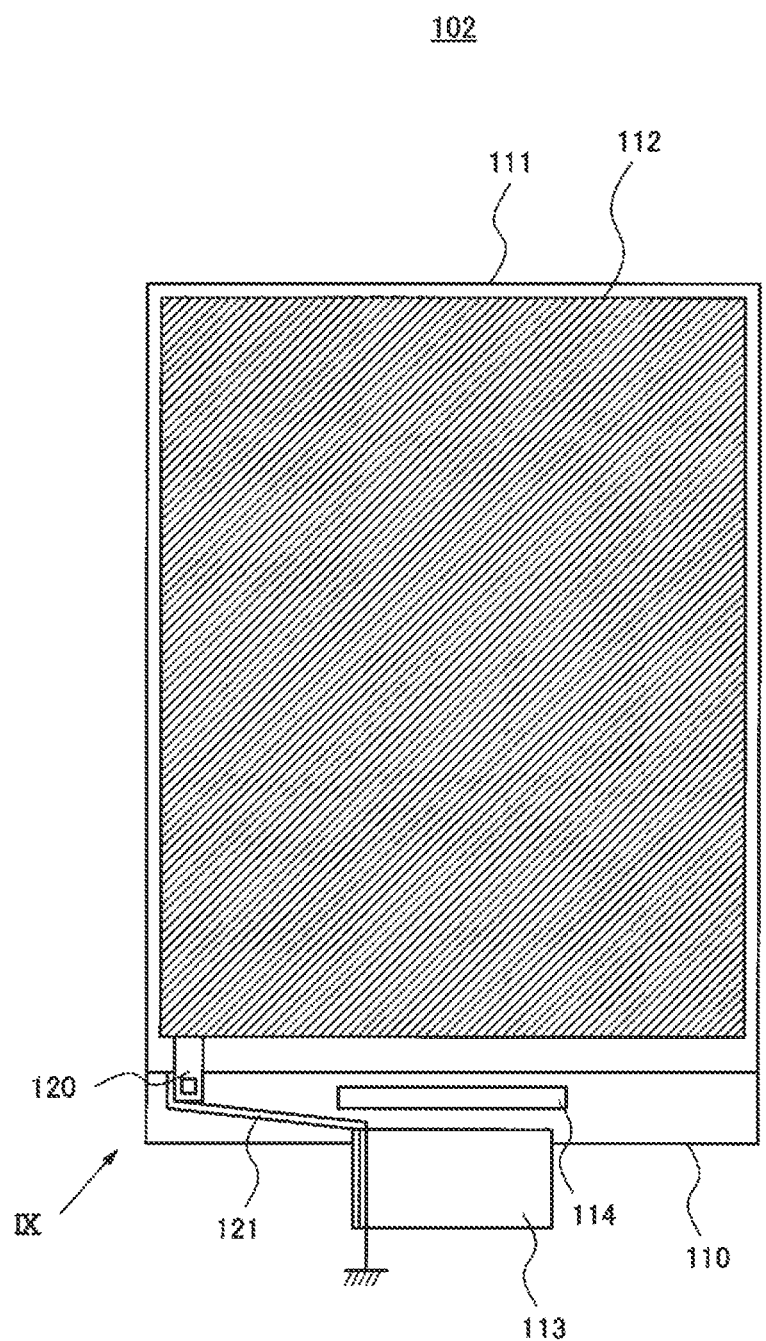
FIG. 8 is a plan view of a liquid crystal display device of a second example according to the present invention.

FIG. 8 is a plan view showing an overall IPS mode liquid crystal display device 102. The IPS mode liquid crystal display device 102 has a TFT substrate 110 and a CF substrate 111. The TFT substrate 110 includes TFT elements, metal wirings, an insulating film, and an alignment film. The CF substrate 111 opposing the TFT substrate 110 includes a CF (color filter) layer and an alignment film. A liquid crystal layer is sandwiched between the TFT substrate 110 and the CF substrate 111. The IPS mode liquid crystal display device 102 is provided with a CF-side polarizer 112 and a TFT-side polarizer which are attached outside surfaces thereof, respectively. On an area where the TFT substrate 110 and the CF substrate 111 do not overlap, an IC 114 supplying a driving signal for the liquid crystal layer, TFT elements, and the FPC 113 supplying a signal to the IC 114 are arranged. On each of outer surfaces of the TFT substrate 110 and the opposing CF substrate 111, an antistatic transparent conductive film is formed usually. The IPS mode liquid crystal display device 102 further includes wirings 121, a backlight module, and the sheet like connection body 120 equipped with a conductive layer.

According to the connecting structure of this example, because a transparent conductive film formed on the outer surface of the CF substrate 111 can be electrically connected to the wirings 121 on the TFT substrate 110, it is possible to prevent an electric charge from accumulating on the CF substrate 111, and suppress display degradation thereby.

Figure 9:
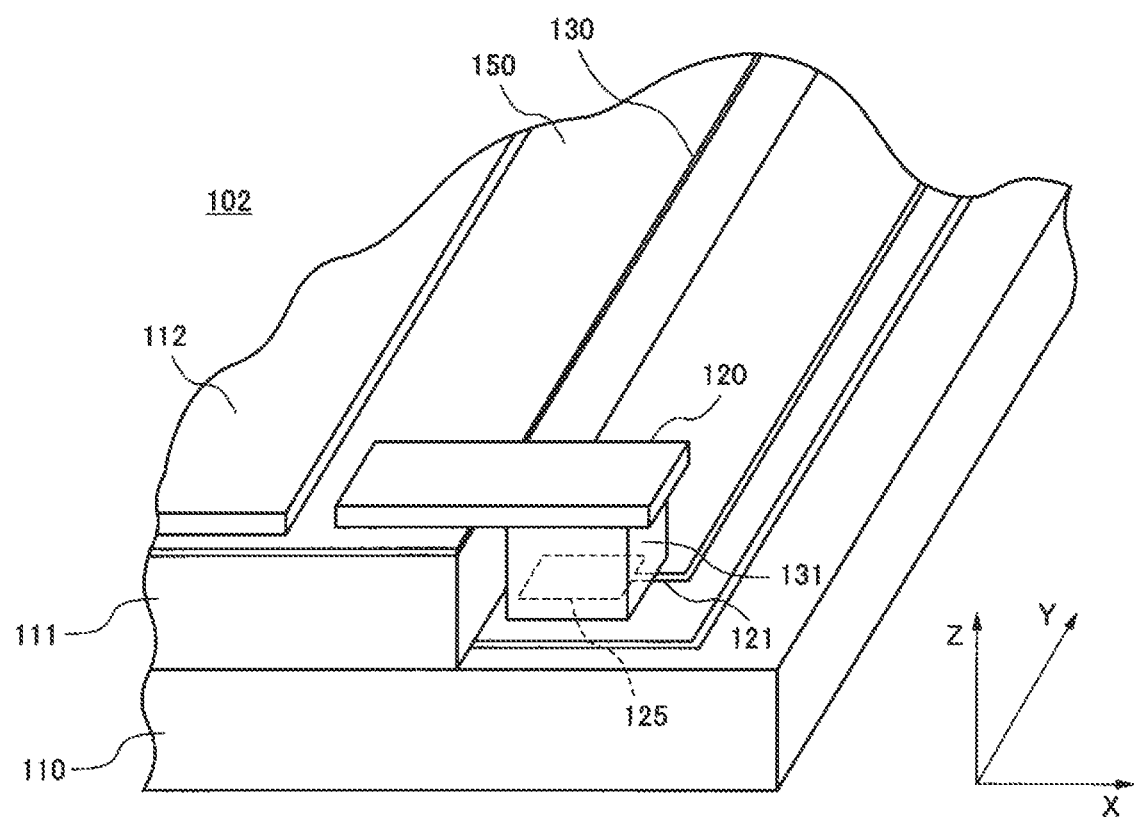
FIG. 9 is a perspective view of a vicinity of the FPC of the liquid crystal display device of the second example according to the present invention.

Next, practical connecting procedures will be described by referring to FIG. 9. FIG. 9 is a perspective view seen from an arrow direction IX shown in FIG. 8. Here, a case will be described in which the above mentioned sheet like connection body according to the second exemplary embodiment is employed as the FPC.

The FPC 120 has a dimension of a longitudinal length of about 3 mm and a lateral length of about 2 mm. An electric conductor 131, which has a height corresponding to a step between the TFT substrate 110 and the CF substrate 111, is connected to an exposed electrode on one of both ends of the FPC 120 in advance. For this connection, it is possible to use a solder which has a higher bonding temperature than a pressure welding temperature of the ACF. As an example of the electric conductor 131, a rectangular solid body made of copper is used. Specifically, the rectangular solid body has such size that its basal plane can cover a connection terminal 125, and its height is approximately equal to the height of the above-mentioned step. Next, each ACF is temporarily press-bonded to the other one of exposed electrodes of the FPC 120 on which the electric conductor 131 is not mounted and to the connection terminal 125 on the TFT substrate 110. Next, the electrode of the FPC 120 provided with the ACF is adjusted to be located on the ITO film 150, while the bottom of the electric conductor 131 is adjusted to be located on the connection terminal 125, and then the whole FPC 120 is welded with pressure by using a pressure welding machine. Thus the connection between one end of the FPC 120 and the ITO film 150, and the connection between the electric conductor 131 and the connection terminal 125 on the TFT substrate 110 can be performed simultaneously. This is because the thermal conductivity of the conductor in the FPC 120 and of the electric conductor 131 connected with the FPC 120 is large, and a heat is easily transmitted through them.

In the foregoing description, although the electric conductor 131 is mounted on the FPC 120 beforehand, the electric conductor 131 can also be temporarily press-bonded to the connection terminal 125 in advance. Such connection procedure will be described below. First, the ACF is temporarily press-bonded to the connection terminal 125, and then the electric conductor, which has the height approximately equal to the height of the above-mentioned step, is temporarily press-bonded to the connection terminal 125. Next, each ACF is temporarily press-bonded to the exposed electrodes on the both ends of the FPC 120. Finally, each electrode on the FPC 120 provided with the ACF is adjusted to be located on the ITO film 150 and a top of the electric conductor 131, respectively, and then the whole FPC 120 is welded with pressure by using the pressure welding machine. Even in this case, because of similar reason to that mentioned above, both connecting processes for the ITO film 150 and the connection terminal 125 can be carried out simultaneously.

Here, even if the height of the electric conductor 131 is not precisely equal to that of the above-mentioned step, since the sheet like connection body has flexibility, a difference between their heights can absorbed, and thus a good connection is obtained. Because of the flexibility of the sheet like connection body, the connecting structure according to this example has also excellent resistance to a thermal expansion and a mechanical stress.

If the thermal capacity of the electric conductor 131 is large, heat accumulates inside the electric conductor 131 for a long time after the heat pressure welding, and thus there is a possibility of causing some problems. However, if the electric conductor 131 is made of a hollow metal or ceramics coated with a thin-film meta, its thermal capacity can be made smaller than metal solid, and thus the above-mentioned problems can be avoided.

Even in the case of this example, the minimum horizontal distance between the edge 130 and the lower part connection terminal 125 can be made smaller close to zero. Because the FPC does not need to be bent beforehand, its mounting processes can be simplified. Further, as mentioned above, the heat pressure welding of the FPC can be carried out with one process.

In the above-mentioned Examples 1 and 2, the LCD integrated with the touch sensor and the IPS-mode LCD are described as examples of the application of the connecting structure. However, such examples of the application are not limited to them, but the present invention can also be applied to other electronic apparatus in which electric connection is required between terminals beyond their step, such as a print head.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

What is claimed is:

1. A connecting structure comprising:
    a laminated structure made of a first substrate and a second substrate each having a plane approximately parallel to an XY-plane in a three-dimensional rectangular coordinate X-Y-Z;
    wherein the first substrate has a first conductor provided on an outside surface of the first substrate, an edge, and an end face including the edge; and further comprising,
    a second conductor provided on an exposed surface of the second substrate to which the first substrates does not oppose;
    a sheet with a flexibility provided with a conductive layer; and
    an electric conductor having a height corresponding to a thickness of the first substrate;
    wherein the sheet is electrically connected to the first conductor and intersects an extended plane of the end face,
    the sheet and the electric conductor are electrically connected to each other at a portion where their Z-coordinate values are as same as a value of the first conductor, and the second conductor is electrically connected to the electric conductor, and
    the electric conductor and the sheet are bonded with material which has higher bonding temperature than temperature for bonding the sheet and the first conductor and temperature for bonding the electric conductor and the second conductor.

2. A display device including the connecting structure according to claim 1, further comprising:
- a liquid crystal layer sandwiched between said first and second substrates,
- wherein one of the first and second substrates is provided with a first electrode and a second electrode on a side of the liquid crystal layer so as to drive the liquid crystal layer by an electric field generated between the first electrode and the second electrode;
- a conductive film provided on an outside of the substrate opposing to the substrate provided with the first and second electrodes;
- a connection terminal provided on an exposed surface of the substrate provided with the first and second electrodes where the opposing substrate does not overlap the substrate provided with the first and second electrodes; and
- a wiring extended from the connection terminal, wherein the connecting structure connects the conductive film to the connection terminal.

3. A display device including the connecting structure according to claim 1, further comprising:
- electro-optical material sandwiched between said first and second substrates, one of the substrates being provided with a conductive film on an outside thereof;
- at least one connection terminal provided on an exposed surface of the other one of the substrates on a side facing said electro-optical material; and
- wirings extended from the at least one connection terminal, wherein the connecting structure connects the conductive film to the at least one connection terminal.

* * * * *